(12) United States Patent
Biber et al.

(10) Patent No.: US 10,663,543 B2
(45) Date of Patent: May 26, 2020

(54) DEVICE AND METHOD FOR RECOVERING A TEMPORAL REFERENCE IN FREE-RUNNING MR RECEIVE CHAINS

(71) Applicants: Stephan Biber, Erlangen (DE); Jan Bollenbeck, Eggolsheim (DE); Sven Heggen, Erlangen (DE); Martin Nisznansky, Erlangen (DE); Markus Vester, Nürnberg (DE)

(72) Inventors: Stephan Biber, Erlangen (DE); Jan Bollenbeck, Eggolsheim (DE); Sven Heggen, Erlangen (DE); Martin Nisznansky, Erlangen (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 79 days.

(21) Appl. No.: 15/951,156

(22) Filed: Apr. 11, 2018

(65) Prior Publication Data

US 2018/0299522 A1   Oct. 18, 2018

(30) Foreign Application Priority Data

Apr. 12, 2017   (EP) .................................... 17166289

(51) Int. Cl.
*G01V 3/00* (2006.01)
*G01R 33/36* (2006.01)
*G01R 33/3415* (2006.01)

(52) U.S. Cl.
CPC ..... *G01R 33/3692* (2013.01); *G01R 33/3415* (2013.01); *G01R 33/3621* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 5,175,754 A * 12/1992 Casey .................... A61B 6/035
378/101
7,123,009 B1   10/2006 Scott
(Continued)

FOREIGN PATENT DOCUMENTS

DE   102011006509 A1   10/2012
DE   102011076918 A1   12/2012
(Continued)

OTHER PUBLICATIONS

European Search Report for European Patent Application No. 17166289.3-1568, dated Nov. 13, 2017.

*Primary Examiner* — Walter L Lindsay, Jr.
*Assistant Examiner* — Frederick Wenderoth
(74) *Attorney, Agent, or Firm* — Lempia Summerfield Katz LLC (57) ABSTRACT

A device for recovering a temporal reference in a free-running magnetic resonance tomography (MRT) receive chain includes a time reference encoder and a time reference decoder. The time reference encoder is configured to generate a modulation signal as a function of a reference clock, where the modulation signal is configured for a correlation with a temporal resolution less than a maximum predetermined phase deviation and a maximum that may clearly be identified. The time reference decoder is configured to receive, via the first signal input, a receive signal as a function of the modulation signal, perform a correlation with a reference signal, and generate a signal as a function of a temporal reference of the modulation signal in the receive signal in relation to the reference signal.

19 Claims, 2 Drawing Sheets

(58) Field of Classification Search
USPC .......................................................... 324/307
See application file for complete search history.

(56) References Cited

U.S. PATENT DOCUMENTS

| | | | |
|---|---|---|---|
| 7,558,618 B1 * | 7/2009 | Williams | A61B 5/0059 |
| | | | 600/407 |
| 7,750,635 B2 | 7/2010 | Van Helvoort et al. | |
| 8,643,362 B2 | 2/2014 | Sekiguchi et al. | |
| 2004/0151345 A1 * | 8/2004 | Morcom | G01S 7/487 |
| | | | 382/104 |
| 2004/0153267 A1 * | 8/2004 | Fishman | H04B 10/07 |
| | | | 702/69 |
| 2009/0054075 A1 * | 2/2009 | Boejer | G01S 19/09 |
| | | | 455/456.1 |
| 2011/0109316 A1 | 5/2011 | Akita et al. | |
| 2012/0249140 A1 | 10/2012 | Albsmeier et al. | |
| 2012/0313645 A1 | 12/2012 | Biber et al. | |
| 2013/0127465 A1 | 5/2013 | Kwon et al. | |
| 2013/0342199 A1 | 12/2013 | Bollenbeck et al. | |
| 2014/0266190 A1 | 9/2014 | Bollenbeck et al. | |
| 2019/0336057 A1 * | 11/2019 | Alford | A61B 5/4064 |

FOREIGN PATENT DOCUMENTS

| | | |
|---|---|---|
| DE | 102012210827 B4 | 1/2014 |
| DE | 102013204705 A1 | 9/2014 |
| EP | 2223136 B1 | 5/2011 |
| WO | 2011073880 A1 | 6/2011 |
| WO | 2015197720 A1 | 12/2015 |

\* cited by examiner

DEVICE AND METHOD FOR RECOVERING A TEMPORAL REFERENCE IN FREE-RUNNING MR RECEIVE CHAINS

This application claims the benefit of EP17166289.3, filed on Apr. 12, 2017, which is hereby incorporated by reference in its entirety.

BACKGROUND

The present embodiments relate to a device and to a method for recovering a temporal reference in a free-running MRT receive chain.

Magnetic resonance tomography systems are imaging devices that for imaging an examination object orient nuclear spins of the examination object using a strong external magnetic field and excite the nuclear spins to precession around this orientation via a magnetic alternating field. The precession or return of the spins from this excited state into a state with lower energy generates a magnetic alternating field as a response, and this is received by antennae.

With the aid of magnetic gradient fields, a spatial encoding is impressed on the signals, and this subsequently enables assignment of the received signal to a volume element. The received signal is then evaluated, and a three-dimensional imaging of the examination object is provided. Local antennae (e.g., local coils) may be used for receiving the signal, and these are arranged directly on the examination object to achieve a better signal-to-noise ratio.

The resonance frequency of the nuclear spins (e.g., the Larmor frequency) is directly proportional to an external static or quasi-static magnetic field, which is composed of the static magnetic field B0 and the gradient fields.

Frequency and phase of the received magnetic resonance signal are relevant to imaging and are to be precisely adhered to with respect to the pulses emitted for excitation of the precession and among each other in the case of a plurality of parallel receivers. Therefore, all emitted signals are conventionally derived from a central reference clock by frequency division, multiplication, or mixing. The same applies to mixed or sample frequencies on the receive path, so there is a fixed phase reference and frequency reference on the entire signal chain. However, for this, all units are to be supplied with corresponding reference signals, and this leads to thicker and unwieldy cables, for example, in the case of local coils.

Document DE 10 2013 204705 describes a magnetic resonance tomography system having wireless transmission of data from the local coil to an MRT base.

From document DE 10 2011 076918, a transmitting device, a magnetic resonance system, and a method for wireless energy transmission to a local coil system are known.

Document DE 10 2012 210827 discloses a method and a device for determining a communications latency in a magnetic resonance tomography system.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an MRT system having simplified handling is provided.

The device for recovering the temporal reference in a free-running MRT receive chain has a time reference encoder having a first signal output. The time reference encoder is configured to generate a modulation signal for modulation of a carrier wave as a function of a reference clock and to output the modulation signal via the first signal output. The reference clock for the temporal reference may be provided by an internal clock generator or by an external reference clock source (e.g., a central clock generator of the magnetic resonance tomography system).

The modulation signal is configured for a correlation with a reference signal having a temporal resolution less than a maximum predetermined phase deviation. This may be achieved, for example, by the modulation signal and the reference signal having a base clock or basic frequency component having a period duration that is less than or equal to the maximum predetermined phase deviation (e.g., less than 1 microsecond, 100 nanoseconds, 10 nanoseconds, or 1 nanosecond). With a correlation with the reference signal, the modulation signal has a maximum that may clearly be identified. The maximum that may clearly be identified may be that the correlation explained below in the description of the figures has a maximum if the modulation signal and the reference signal temporally match or are in phase, and this maximum is superior compared to secondary maximums, which may occur with a temporal offset of the modulation signal in relation to the reference signal (e.g., due to a greater amplitude that is more than 3 dB, 6 dB, or 12 dB above the level(s) of the secondary maximum(s)). The level of the maximum may also be more than 3 dB, 6 dB, 12 dB, or 18 dB above a noise level that is generated by the correlation in the case of a random input signal instead of the modulation signal. A sharp maximum of this kind that has an outstanding level may be achieved in addition to a choice of the reference or modulation signal described below by an adequate length of the signal (e.g., longer than 10, 20, 50, or 100 periods of the base clock or level change).

Examples of possible modulation signals or generation of the modulation signals are provided below. The time reference encoder may be implemented, for example, in a logic chip or a processor.

The device of one or more of the present embodiments has a time reference decoder having a first signal input.

The first signal input is configured to receive a receive signal as a function of the modulation signal. For example, the receive signal may originate from a receiver that receives a carrier wave modulated with the modulation signal of the time reference encoder. The time reference decoder is configured to perform a correlation with the reference signal and to generate a signal as a function of a temporal relationship of the modulation signal in the receive signal with the reference signal. In the simplest case, the reference signal may be the signal used in the time reference encoder or a signal derived therefrom, which is supplied to the time reference decoder via a second signal input. The time reference decoder is then configured to generate a signal as a function of a delay of the receive signal in relation to the reference signal.

However, the time reference decoder may have stored the modulation signal in a storage device or is generated with a same structure to the structure in the time reference encoder. The time reference decoder may be configured to generate a signal as a function of an advance of the modulation signal modulated in the receive signal with respect to the reference signal (e.g., via the address or counter of the memory cell of the stored reference signal), which corresponds to the current step in the received modulation signal.

In one embodiment, the time reference decoder may output the generated signal either via a second signal output or may use the generated signal internally in the case of processing of the receive signal (e.g., modifies the receive signal as a function of the temporal relationship with the reference clock by an item of time information being added to the receive signal or the receive signal being delayed by a duration dependent on the generated signal).

The device enables a time reference to be transmitted with a radio frequency signal and this time reference to then be evaluated, so a frequency reference and phase reference may be produced without additional distribution of reference clocks among all involved elements of the MR receive chain. In this way, the receive chain may be changed, or different receiving channels may be implemented in different ways without having to perform an external calibration in each case.

The magnetic resonance tomography system and the method share the advantages of the device of the present embodiments.

In one embodiment of the device, the time reference encoder has a pseudo-random binary sequence generator (e.g., PRBS generator).

A pseudo-random binary sequence generator offers a simple option for providing a modulation signal for a correlation.

In one embodiment, the pseudo-random binary sequence generator has a shift register logic circuit having linear feedback.

A shift register logic circuit having linear feedback offers a particularly simple option for generating pseudo-random sequences that depend on a start value.

In one embodiment of the device, the pseudo-random binary sequence generator is configured to generate a gold, Kasami, or JPL sequence.

The pseudo-random sequences have advantageous properties in the case of correlation, such as quick convergence and/or a sharp maximum with convergence of the correlation.

In one embodiment of the device, the time reference decoder has a PLL-controlled frequency-variable oscillator. The oscillator is configured to recover a clock signal of the pseudo-random generator from the receive signal the phase feedback loop. Implementation in an analog design as well as digitally via logic circuits or as a program in digital signal processing may be provided.

In one embodiment, owing to the phase position determined by the correlation, the frequency-variable oscillator may be synchronized with a clock signal underlying the pseudo-random code during generation, and the clock signal in the receiver may be provided with synchronous frequency and defined phase position.

The magnetic resonance tomography system of one or more of the present embodiments has a device. The magnetic resonance tomography system has a central clock generation, where the reference signal input of the time reference encoder has a signal link to the central clock generator in order to obtain a reference clock. The magnetic resonance tomography system also has a radio frequency generator that is configured to generate a carrier wave as a function of the central clock generator and to modulate the carrier wave as a function of the modulation signal.

In one embodiment, the time reference encoder may have a separate clock generation with sufficient accuracy, or the time reference encoder may even be set up in this way as a central clock generator of the magnetic resonance tomography system.

The central clock generator provides that different processes of the magnetic resonance tomography system run synchronously with each other and with the same frequency ratio, so reciprocal interference (e.g., due to harmonics) is ruled out. The radio frequency generator also uses the better frequency stability of the central clock generation.

In one embodiment of the magnetic resonance tomography system, the carrier wave has a frequency that lies in a frequency range of a Larmor frequency of the magnetic resonance tomography system (e.g., the Larmor frequency of a hydrogen nucleus).

The radio frequency signal is regarded as the carrier wave, and this is finally irradiated with an antenna in order to transmit the sequence impressed with the modulation signal to a receiver. The radio frequency signal is also regarded as modulation of the carrier wave if a radio frequency signal is modulated with a frequency that is different from the frequency of the carrier wave and subsequently, the carrier wave is then generated therefrom by mixing or frequency multiplication.

The carrier wave uses the frequency range of the Larmor frequency of the magnetic resonance tomography system, which is also used for imaging by nuclear magnetic resonance, so parts of the magnetic resonance tomography system may be used jointly for imaging and time reference signal. Designated as the frequency range is a range of frequencies that the receiver of the magnetic resonance tomography system may use and process for imaging. With a magnetic field strength B0, given by a field magnet of the magnetic resonance tomography system, the range may deviate from the Larmor frequency by more than 0.5%, 1%, or 2% or by 0.5 MHz, 1 MHz, or 2 MHz. The frequencies at which attenuation of an incoming radio frequency signal occurs compared to a strength at the Larmor frequency by, for example, no more than 3 dB, 6 dB, or 12 dB may be used for definition of the limits of the range. The Larmor frequency may be the resonance frequency of the spin of a hydrogen nucleus in the magnetic field B0, but may also include Larmor frequencies of other elements that are to be examined.

In one embodiment of the magnetic resonance tomography system, the magnetic resonance tomography system has a transmitting antenna for emitting the carrier wave, and a receiving antenna and a receiver for receiving the carrier wave and generating the receive signal. The receiver has a signal link to the time reference decoder and is configured to supply the first signal input of the time reference decoder with the receive signal.

In one embodiment of the magnetic resonance tomography system, the magnetic resonance tomography system is configured to acquire a magnetic resonance signal for imaging via the receiver.

Use of the frequency range around the Larmor frequency enables a signal with the modulated carrier wave to be received and evaluated with the MR receive chain, which is also used for imaging. For example, the phase relationship and frequency relationship or delay in the receive chain may also be determined therefore, and/or a clock signal may be wirelessly transmitted to different units.

In one embodiment of the magnetic resonance tomography system, the radio frequency generator is configured to modulate the carrier wave with the modulation signal by frequency spreading modulation. One example of a frequency spreading modulation is code division multiple access (CDMA), although, for example, direct sequence spread spectrum (DSSS), frequency hopping spread spectrum (FHSS) or chirp spread spectrum (CSS) may also be provided. The level of the modulated carrier frequency may be below a noise level of the MRT signal.

For transmission of the modulation signal, a frequency spreading modulation allows a carrier wave in the range of the Larmor frequency to be used, so for transmission of the modulation signal, a frequency range that wholly or partially overlaps the frequency range of the MRT signals used for the imaging scans is used. Via frequency spreading modulation, signal levels of the carrier wave that lie below the noise threshold of the MRT signal and yet may still be detected may be used, and/or due to the known structure of the signal of the carrier wave, this may be wholly or partially removed from the receive signal In one embodiment of the magnetic resonance tomography system, the magnetic resonance tomography system has a local coil having a time reference decoder. For example, a time reference decoder having PLL and frequency-variable oscillator may also be provided.

The time reference decoder enables a time reference to be produced for a local coil without a reference clock having to be supplied in a wired manner. For example, by a PLL-controlled variable frequency oscillator (VFO), a highly accurate frequency with a predetermined phase relationship may be provided for downmixing to an IF or a direct digitization.

In one embodiment of the magnetic resonance tomography system, the magnetic resonance tomography system has a plurality of receivers for receiving a magnetic resonance signal and a plurality of time reference decoders with a signal link to a receiver in each case.

The time reference decoder in the individual receivers allows the signal paths to be synchronized and a clear phase relationship to be determined for different receive paths as well. Therefore, for example, different coil types and signal processing operations may be variably mixed, and the time delay may be transparently determined and considered simultaneously without a manual intervention being necessary or the properties of changed signal paths having to be input in detail.

DETAILED DESCRIPTION

Figure 1:
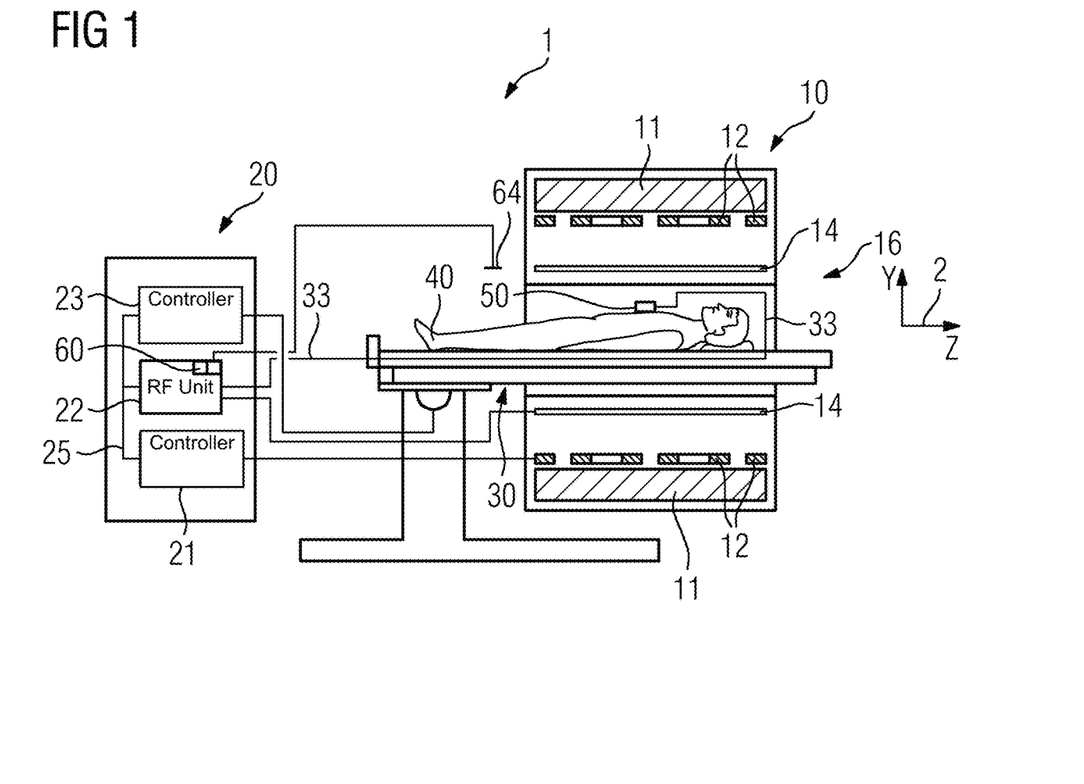
FIG. 1 shows an exemplary schematic diagram of one embodiment of a magnetic resonance tomography system having a device for recovering temporal reference in a free-running MRT receive chain.

FIG. 1 shows a schematic diagram of an embodiment of a magnetic resonance tomography system 1 having a device 60 for recovering a temporal reference in a free-running magnetic resonance tomography (MRT) receive chain.

The magnetic unit 10 has a field magnet 11 that generates a static magnetic field B0 for orienting nuclear spins of samples or patients 40 in a recording region. The recording region is arranged in a patient tunnel 16 that extends through the magnetic unit 10 in a longitudinal direction 2. The field magnet 11 is conventionally a superconducting magnet that may provide magnetic fields having a magnetic flux density of up to 3T, or even above this in the newest equipment. For lower field strengths, permanent magnets or electromagnets having normal conducting coils may also be used, however.

Spatial differentiations of the acquired imaging regions in the examination volume the magnetic unit 10 has gradient coils 12 that are configured to overlay variable magnetic fields in three spatial directions on the magnetic field B0. The gradient coils 12 are conventionally coils made of normal conducting wires that may generate mutually orthogonal fields in the examination volume.

The magnetic unit 10 also has a body coil 14 that is configured to irradiate a radio frequency signal supplied via a signal line 33 into the examination volume and to receive resonance signals emitted by the patient 40 and to emit the resonance signals via a signal line. In one embodiment, the body coil 14 is replaced for emitting the radio frequency signal and/or receiving via local coils 50 that are arranged close to the patient 40 in the patient tunnel 16. In one embodiment, the local coil 50 is configured for sending and receiving, and therefore, a body coil 14 may be omitted.

A control unit 20 supplies the magnetic unit 10 with the various signals for the gradient coils 12 and the body coil 14 and evaluates the received signals.

The control unit 20 therefore has a gradient controller 21 that is configured to supply the gradient coils 12 via supply lines with variable currents that provide the desired gradient fields in the examination volume in a coordinated manner.

The control unit 20 has a radio frequency unit 22 that is configured to generate a radio frequency pulse with a predefined temporal course, amplitude, and spectral power distribution in order to excite a magnetic resonance of the nuclear spins in the patient 40. Pulse powers in the region of kilowatts may be achieved here. The individual units are connected together by a signal bus 25.

The radio frequency signal generated by the radio frequency unit 22 is supplied via a signal link 33 to the patient couch 30 and distributed among one or more local coil(s) 50 and emitted into the body of the patient 40 to excite the nuclear spins there. Emitting of the radio frequency signal via the body coil 14 may also be provided, however.

The local coil 50 may then receive a magnetic resonance signal from the body of the patient 40 because, owing to the small spacing, the signal-to-noise ratio (SNR) of the local coil 50 is better than in the case of receiving via the body coil 14. The MR signal received by the local coil 50 is processed in the local coil 50 and forwarded to the radio frequency unit 22 of the magnetic resonance tomography system 1 for evaluation and image acquisition. The signal link 33 may also be used for this although separate signal links or wireless transmission may also be provided. In one embodiment, separate local coils or other antennae are provided for receiving In the exemplary embodiment of FIG. 1, the device 60 for recovering the temporal reference in a free-running MRT receive chain of one or more of the present embodiments is arranged in the radio frequency unit 22, although other functional distributions, some of which are described below, may also be provided.

Figure 2:
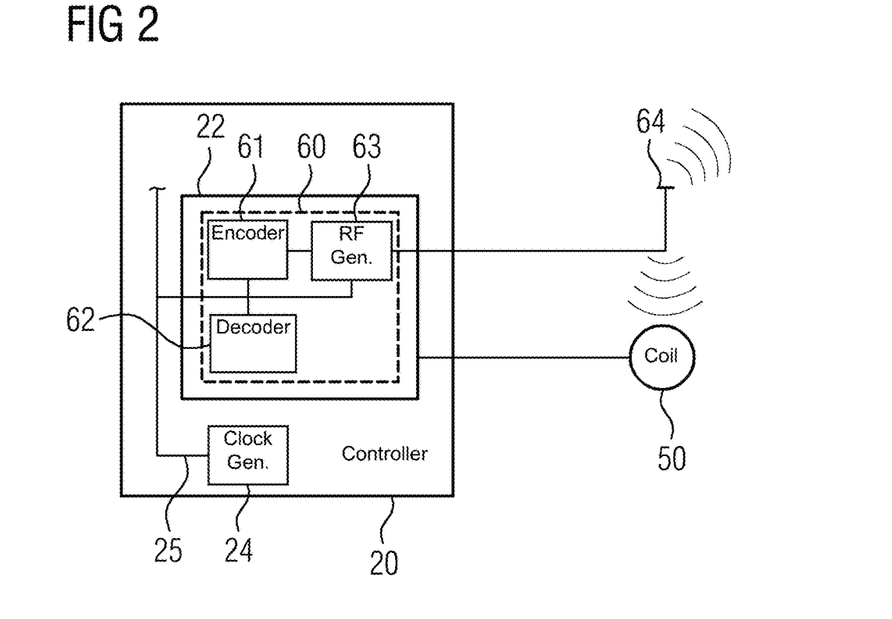
FIG. 2 shows a schematic functional diagram of one embodiment of a device for recovering the temporal reference in a free-running MRT receive chain.

FIG. 2 shows a schematic functional diagram of one embodiment of a device 60 for recovering the temporal reference in a free-running MRT receive chain. For the sake of clarity, not all elements of FIG. 1 are shown in FIG. 2. Same reference numbers designate same articles.

The radio frequency unit 22 of FIG. 2 has a time reference encoder 61. In the illustrated embodiment, the time reference encoder 61 receives a reference clock from a central clock generator 24 of the controller 20 of the magnetic resonance tomography system 1 via the signal bus 25.

The time reference encoder 61 generates a modulation signal as a function of the reference clock. The modulation signal is output at a first output of the time reference encoder 61 and supplied to a radio frequency generator 63, which modulates a carrier wave therewith. The carrier wave may have a frequency close to the Larmor frequency of the magnetic resonance tomography system 1 or in the region of the Larmor frequency and of the MRT signal of the magnetic resonance tomography system 1. The modulated carrier wave is irradiated in predetermined time segments or continuously via the antenna 64, so the local coil 50 or the local coils 50 and/or the body coil 14 may receive the carrier wave.

In the embodiment illustrated in FIG. 2, the signal of the carrier wave received from the local coil 50 and/or body coil 14 may be processed further by the receive chain of the MR signals for imaging. Amplification, filtering, and/or conversion may occur in a different frequency range to the intermediate frequency. Digitization via an A/D converter may also be provided. This provides that the signal of the carrier wave passes through the same path as an MR signal, and all processing acts and the delays associated therewith have the same effect on the signal of the carrier wave and the MR signal.

The time reference encoder 21 generates a modulation signal that, following transmission via the MRT receive chain, through correlation with a reference signal is capable of being identified and of being assigned with respect to a temporal shift to the original modulation signal. Since the receive signal and the reference signal have the modulation signal, this process may also be autocorrelation for the modulation signal.

Suitable as a modulation signal are, for example, pseudo-random binary sequences (PRBS) that are generated in advance and are stored in a storage device or are generated in real time by a logic circuit (e.g., by a linear feedback shift register (LFSR)) as a function of a predetermined start value, the feedback, and the reference clock. Binary sequences of different length may be provided as the modulation signal. The longer a used binary sequence is, the longer an interval is for which a value for the delay of the receive signal may be clearly determined by the binary sequence. At the same time, the sharpness of the correlation function also increases with the length. The correlation $R_{12}(m)$ is calculated by the integral or the sum (e.g., discrete values) of the product of the modulation function si with a modulation function 52 shifted by a period m $$R_{12}(m) = \frac{1}{N} \sum_{n=0}^{N} s_1(n+m) s_2^*(n)$$

Examples of pseudo-random binary sequences suitable for the modulation signal are Gold sequences, Kasami sequences, or JPL sequences.

Modulation may take place in different ways. Modulation may, for example, occur in a narrow band, so only a small frequency range is occupied, and the modulated carrier wave still falls in a receiving range of the local coil 50 and radio frequency unit 22 but does not overlap the MR signal of the nuclear spins for imaging. Frequency or amplitude modulation, for example, may be provided.

Broadband modulation methods that employ a spread spectrum to distribute the modulated information in a broad frequency range may also be used. One example of frequency spreading modulation is code division multiple access (CDMA), although, for example, direct sequence spread spectrum (DSSS), frequency hopping spread spectrum (FHSS), or chirp spread spectrum (CSS) may also be provided. Using corresponding demodulation methods on the receiver side, signals below the noise level may also be received. If, therefore, in an embodiment, the power of the carrier wave is reduced such that the receive level in the local coils 50 or the body coil 14 remains below a noise threshold of the MR signal, the carrier wave may be permanently sent without adversely affecting imaging.

In one embodiment, the device 60 of one or more of the present embodiments may only emit the modulated carrier wave temporarily. For example, a synchronization of the receive chain may only occur in each case following an excitation of the nuclear spins via a radio frequency pulse before the MR signals of the nuclear spins are received by the receive chain in each case. Repeated emitting of the modulated carrier wave may also be provided, for example, in the case of FAST sequences without respective excitation. With temporary emitting of this kind, emitting may occur via the radio frequency unit 22, which also generates the excitation pulses. The radio frequency unit 22 is to be configured to generate a carrier wave of sufficiently low power and modulated with the modulation signal in order not to overload the receive chain.

Demodulation of the receive signal of the modulated carrier wave occurs in the time reference decoder 62 or via an upstream demodulator. Demodulation occurs complementarily to modulation used (e.g., with amplitude modulation, via rectification of the radio frequency signal, with frequency modulation, via a high- or low-pass or a PLL, and with frequency spreading modulation, via corresponding demodulators with a correlation).

The original modulation signal is reconstructed via demodulation. With a pseudo-random number sequence (e.g., by a correlation of a reference pseudo-random number sequence), the temporal position of the received pseudo-random number sequence may be determined with respect to this reference and a corresponding delay signal generated.

In FIG. 2, the time reference decoder(s) 62 is/are arranged in the central radio frequency unit 22, so, for example, all time reference decoders 62 may be supplied with a central clock from a central clock generator 24 and synchronously with a reference pseudo-random number sequence from a shared source, or a shared reference modulation signal. However, the modulation signal may also be stored in the time reference decoder 62 or be locally generated by a logic circuit.

In an embodiment, the time reference decoder(s) 62 is/are implemented as a function in signal processing of a digital receiver. Separate time reference decoders 62, however, that evaluate the receive signal and are implemented, for example, as analog circuits, programmed logic circuits, signal processors, or combinations thereof may also be provided.

The controller 23 may be configured to take into account the generated delay signal during processing of MR signals to form an image. For example, the phases of the received MR signals may be corrected accordingly.

Figure 3:
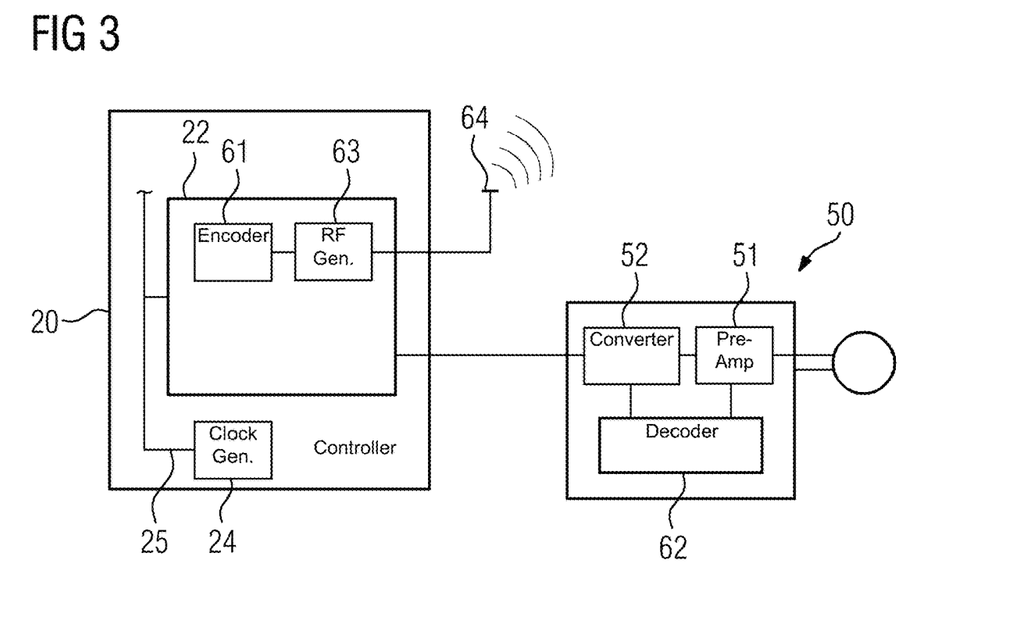
FIG. 3 shows a schematic functional diagram of a further possible embodiment of a device for recovering the temporal reference in a free-running MRT receive chain.

FIG. 3 shows a further possible embodiment of a device for recovering the temporal reference in a free-running MRT receive chain. Same articles are again designated by same reference characters. As in FIG. 2, not all elements of FIG. 1 are shown.

The embodiment of FIG. 3 differs from that in FIG. 2 primarily in that the time reference decoder(s) 62 is/are not provided in the central radio frequency unit 22, but in the local coil(s) 50.

In the embodiment in FIG. 3, the time reference decoder 62 has for this purpose a separate source, respectively, for a reference modulation signal (e.g., a storage device), in which the pseudo-random number sequence is stored, or a logic circuit, which generates the pseudo-random number sequence in situ. Following amplification of the received signal by a preamplifier (e.g., low noise amplifier LNA), this is supplied via a signal link to the signal reference decoder 62 for evaluation. The signal reference decoder 62 generates a signal therefrom that specifies a temporal reference to the reference modulation signal.

In one embodiment of FIG. 3, the received MR signal is digitized in a converter 52 of the local coil 50. The time reference decoder 62 adds a time stamp to the receive signal. The stamp, with the aid of the received modulated carrier wave, specifies a temporal relationship of the data generated from the receive signal with respect to the reference modulation signal and thereby also a temporal reference to a central clock transmitted with the carrier wave. In this way, the different temporal delays, for example, for different local coils 50 may be taken into account in the imaging in subsequent imaging. Depending on the modulation signal used, a time window, within which the time stamp is unequivocal, may be specified. With longer lengths, for example, of the pseudo-random number sequence, greater differences in the delay in the different receive paths may also be covered in this way.

However, the time reference decoder 62 may use a signal of the converter 52 that has already been digitized, and the signal received and amplified by the pre-amplifier 51 may therefore be obtained from the converter 52.

Additionally or alternatively, the time reference decoder 62 may obtain a reference clock from the modulation signal transmitted by the carrier wave. With appropriate choice of the pseudo-random number sequence, using an oscillator with phase feedback loop (e.g., phase lock loop, PLL), the original bit clock of the pseudo-random number sequence may be recovered. This clock may be used, for example, for synchronous digitization using an A/D-converter. Use as a local oscillator for conversion of the receive signal to an intermediate frequency may also be provided.

Figure 4:
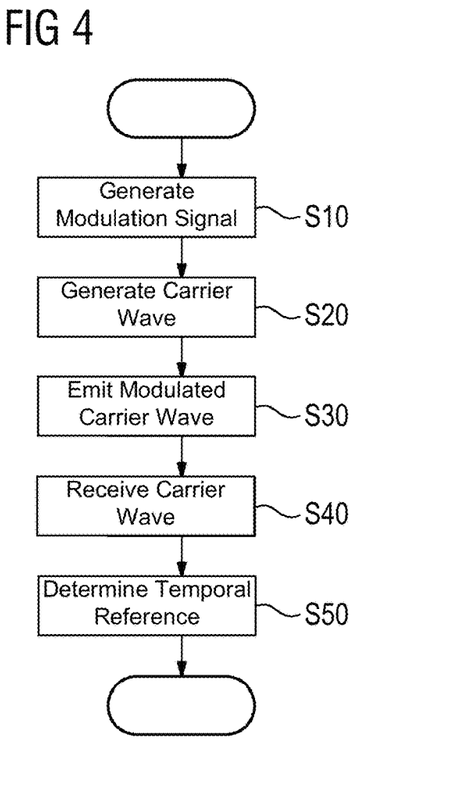
FIG. 4 shows a schematic flowchart of one embodiment of a method for recovering the temporal reference in a free-running MRT receive chain.

FIG. 4 shows a schematic flowchart of one embodiment of a method for recovering the temporal reference in a free-running MRT receive chain.

A modulation signal is generated in act S10. The modulation signal is suitable for correlation (e.g., the temporal position of a temporally shifted modulation signal may be determined by a reference modulation signal). The modulation signal may, for example, be stored in a storage device and be read from the storage device for generation. Generation from a start value by a logic circuit (e.g., a linear feedback shift register) may also be provided. Generation occurs as a function of a reference clock of a central clock generator 24 using a time reference encoder 61. In one embodiment, the central clock generator 24 may be part of the time reference encoder 61.

In a further act S20, a carrier wave is generated by a radio frequency generator 63 as a function of the reference clock. For example, a frequency synthesizer may be provided. The carrier wave is modulated with the modulation signal by the radio frequency generator 63 (e.g., by amplitude modulation, frequency modulation, or frequency spreading modulation).

The modulated carrier wave is emitted via an antenna 64 in act S30.

In a further act S40, the carrier wave is received by a receiving antenna (e.g., a receiver coil of a local coil 50), forwarded to a receiver, and a receive signal is generated by the receiver.

In act S50, a temporal reference between receive signal and reference clock is determined by the time reference decoder 62. For this, the time reference decoder 62 compares a reference signal by correlation with the receive signal and in this way, determines a time reference between the reference signal and the received modulation signal. The time reference decoder 62 outputs a time reference signal as a function of the determined temporal reference.

In one possible further act, imaging occurs via a control unit 20 as a function of the time reference signal.

Although the invention has been illustrated and described in detail by the exemplary embodiments, the invention is not limited by the disclosed examples. A person skilled in the art may derive other variations herefrom without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for recovering a temporal reference in a free-running magnetic resonance tomography (MRT) receive chain, the device comprising:
    a time reference encoder having a first signal output; and
    a time reference decoder having a first signal input,
    wherein the time reference encoder is configured to:
        generate a modulation signal as a function of a reference clock for modulation of a carrier wave, wherein the reference clock has a period duration of less than 1 microsecond; and
        output the modulation signal via the first signal output,
    wherein the modulation signal is configured for a correlation with a temporal resolution less than a maximum predetermined phase deviation and a maximum that is clearly identifiable, and
    wherein the time reference decoder is configured to:
        receive via the first signal input a receive signal as a function of the modulation signal;
        perform a correlation with a reference signal; and
        generate a signal as a function of a temporal reference of the modulation signal in the receive signal in relation to the reference signal.

2. The device of claim 1, wherein the time reference encoder includes a pseudo-random binary sequence generator configured to generate the modulation signal.

3. The device as claimed in claim 2, wherein the pseudo-random binary sequence generator includes a shift register logic circuit with linear feedback.

4. The device of claim 1, wherein the pseudo-random binary sequence generator is configured to generate a gold sequence, a Kasami sequence, or a JPL sequence.

5. The device of claim 2, wherein the time reference decoder includes a PLL-controlled frequency-variable oscillator, and
wherein the PLL-controlled frequency-variable oscillator is configured to recover a clock signal of the pseudo-random generator.

6. A magnetic resonance tomography system comprising:
a device for recovering a temporal reference in a free-running magnetic resonance tomography (MRT) receive chain, the device comprising:
a time reference encoder having a first signal output; and
a time reference decoder having a first signal input, wherein the time reference encoder is configured to:
generate a modulation signal as a function of a reference clock for modulation of a carrier wave; and
output the modulation signal via the first signal output, wherein the modulation signal is configured for a correlation with a temporal resolution less than a maximum predetermined phase deviation and a maximum that is clearly identifiable,
wherein the time reference decoder is configured to:
receive via the first signal input a receive signal as a function of the modulation signal;
perform a correlation with a reference signal; and
generate a signal as a function of a temporal reference of the modulation signal in the receive signal in relation to the reference signal,
wherein the magnetic resonance tomography system has a central clock generation, and the time reference encoder has a reference signal input, and
wherein the reference signal input of the time reference encoder has a signal link to the central clock generator to obtain a reference clock;
a radio frequency generator configured to:
generate the carrier wave as a function of the central clock; and
modulate the carrier wave as a function of the modulation signal.

7. The magnetic resonance tomography system of claim 6, wherein a frequency of the carrier wave lies in a frequency range of a Larmor frequency of the magnetic resonance tomography system.

8. The magnetic resonance tomography system of claim 7, wherein the Larmor frequency is the Larmor frequency of a hydrogen nucleus.

9. The magnetic resonance tomography system of claim 7, wherein the radio frequency generator is further configured to modulate the carrier wave with the modulation signal by frequency spreading modulation.

10. The magnetic resonance tomography system of claim 6, wherein the magnetic resonance tomography system further comprises:
a transmitting antenna for transmitting the carrier wave;
a receiving antenna for receiving the carrier wave; and
a receiver configured to generate the receive signal,
wherein the receiver has a signal link to the time reference decoder and is configured to supply the receive signal to the first signal input of the time reference decoder.

11. The magnetic resonance tomography system of claim 10, wherein the magnetic resonance tomography system is configured to acquire a magnetic resonance signal for imaging via the receiver.

12. The magnetic resonance tomography system of claim 6, wherein the magnetic resonance tomography system further comprises a local coil, the local coil including a time reference decoder.

13. The magnetic resonance tomography system of claim 9, wherein the magnetic resonance tomography system further comprises:
a plurality of receivers for receiving a magnetic resonance signal; and
a plurality of time reference decoders having a signal link to a receiver in each case.

14. A method for recovering a temporal reference in a free-running magnetic resonance tomography (MRT) receive chain having a magnetic resonance tomography system, the method comprising:
generating, by a time reference encoder, a modulation signal for correlation as a function of a reference clock of a central clock;
generating, by a radio frequency generator, a carrier wave as a function of the reference clock;
modulating the carrier wave with the modulation signal;
emitting the modulated carrier wave via a first antenna;
receiving, by a second antenna, the carrier wave;
generating, by a receiver, a receive signal;
determining, by the time reference decoder, a temporal reference between the receive signal and the reference clock by a correlation calculation by outputting a time reference signal as a function of the determined temporal reference.

15. The method of claim 14, further comprising performing, by the magnetic resonance tomography system, an image evaluation as a function of the time reference signal.

16. A computer program product comprising a non-transitory computer-readable storage medium that stores instructions executable by a processor of a programmable controller to recover a temporal reference in a free-running magnetic resonance tomography (MRT) receive chain having a magnetic resonance tomography system, the instructions comprising:
generating, by a time reference encoder, a modulation signal for correlation as a function of a reference clock of a central clock;
generating, by a radio frequency generator, a carrier wave as a function of the reference clock;
modulating the carrier wave with the modulation signal;
emitting the modulated carrier wave via a first antenna;
receiving, by a second antenna, the carrier wave;
generating, by a receiver, a receive signal;
determining, by the time reference decoder, a temporal reference between the receive signal and the reference clock by a correlation calculation by outputting a time reference signal as a function of the determined temporal reference.

17. The computer program product of claim 16, wherein the instructions further comprise performing, by the magnetic resonance tomography system, an image evaluation as a function of the time reference signal.

18. In a non-transitory computer-readable storage medium that stores instructions executable by a controller of a magnetic resonance tomography system to recover a temporal reference in a free-running magnetic resonance tomography (MRT) receive chain having a magnetic resonance tomography system, the instructions comprising:
- generating, by a time reference encoder, a modulation signal for correlation as a function of a reference clock of a central clock;
- generating, by a radio frequency generator, a carrier wave as a function of the reference clock;
- modulating the carrier wave with the modulation signal;
- emitting the modulated carrier wave via a first antenna;
- receiving, by a second antenna, the carrier wave;
- generating, by a receiver, a receive signal;
- determining, by the time reference decoder, a temporal reference between the receive signal and the reference clock by a correlation calculation by outputting a time reference signal as a function of the determined temporal reference.

19. The non-transitory computer-readable storage medium of claim 18, wherein the instructions further comprise performing, by the magnetic resonance tomography system, an image evaluation as a function of the time reference signal.

* * * * *